United States Patent [19]

Lapin et al.

[11] Patent Number: 5,437,964
[45] Date of Patent: Aug. 1, 1995

[54] STEREOLITHOGRAPHY USING VINYL ETHER-EPOXIDE POLYMERS

[75] Inventors: Stephen C. Lapin, Wauconda; James R. Snyder, Chicago; Eugene V. Sitzmann, Des Plaines; Darryl K. Barnes, Bellwood; George D. Green, Park Ridge, all of Ill.

[73] Assignee: Allied-Signal Inc., Morris Township, Morris County, N.J.

[21] Appl. No.: 201,146

[22] Filed: Feb. 24, 1994

Related U.S. Application Data

[63] Continuation of Ser. No. 855,392, Mar. 26, 1992, abandoned, which is a continuation-in-part of Ser. No. 693,890, May 1, 1991, abandoned.

[51] Int. Cl.⁶ .................. G03C 5/00; G03C 1/725; C08F 2/46
[52] U.S. Cl. .................. 430/280; 430/269; 522/168; 522/170
[58] Field of Search ............. 522/170, 168; 430/269, 430/280

[56] References Cited

U.S. PATENT DOCUMENTS

| | | | |
|---|---|---|---|
| 3,311,575 | 3/1967 | Graham | 526/266 |
| 4,575,330 | 3/1986 | Hull | 425/174.4 |
| 4,645,781 | 2/1987 | Koleske | 522/170 |
| 4,844,144 | 7/1989 | Murphy et al. | 164/38 |
| 4,885,319 | 12/1989 | Dougherty | 522/170 |
| 4,942,001 | 7/1990 | Murphy et al. | 264/22 |
| 4,956,198 | 9/1990 | Shama et al. | 427/54.1 |
| 5,036,112 | 7/1991 | Dougherty | 522/181 |
| 5,039,716 | 8/1991 | Vara | 522/170 |
| 5,045,572 | 9/1991 | Plotkin | 522/170 |
| 5,055,357 | 10/1991 | Plotkin | 522/170 |
| 5,106,885 | 4/1992 | Liu | 522/170 |
| 5,139,872 | 8/1992 | Lapin | 428/378 |

FOREIGN PATENT DOCUMENTS

| | | |
|---|---|---|
| 1246785 | 12/1988 | Canada . |
| 0171069 | 12/1986 | European Pat. Off. . |
| 0360869 | 4/1990 | European Pat. Off. . |
| 0429250 | 5/1991 | European Pat. Off. . |
| 2355794 | 1/1978 | France . |
| WO90/01512 | 2/1990 | WIPO . |
| WO89/08021 | 2/1990 | WIPO . |
| WO90/03989 | 4/1990 | WIPO . |
| 9111466 | 8/1991 | WIPO . |

OTHER PUBLICATIONS

Lapin, Chemical Abstracts No. 115:116379c "Vinyl Ether . . . ", vol. 115, No. 12, pp. 95, Sep. 1991.
Crivello et al., "Photoinitiated Cationic Polymerization with Multifunctional Vinyl Ether Monomers", Jan. 1983, pp. 6–13.
C. W. Hull, "Recent Advances in Stereolithography", Oct. 1, 1990.

*Primary Examiner*—Mark A. Chapman
*Attorney, Agent, or Firm*—Harold N. Wells; Roger H. Criss

[57] ABSTRACT

Polymer precursor formulations suitable for stereolithography may be prepared from compositions containing vinyl ether functionalized compounds and epoxy functionalized compounds plus an effective amount of a cationic photoinitiator.

22 Claims, 2 Drawing Sheets

STEREOLITHOGRAPHY USING VINYL ETHER-EPOXIDE POLYMERS

REFERENCE TO RELATED APPLICATIONS

This application is a continuation of application Ser. No. 07/855,392, filed Mar. 26, 1992, now abandoned, which is continuation-in-part of application Ser. No. 07/693,890, filed May 1, 1991, now abandoned.

PRIOR ART

This invention relates to the art of stereolithography, which is a technique for forming solid shapes from a liquid polymer precursor. More particularly, the invention relates to improvements in such polymer precursors.

Stereolithography is described in U.S. Pat. No. 4,575,330 to Hull. The method involves building up a predetermined three-dimensional shape by forming a series of layers of polymerized solids. A cross-section of the solid is traced out on the surface of a bath of polymer precursors under the direction of a computer controlled system which causes the liquid to be exposed to a form of radiation such as an ultraviolet laser. After each polymerized layer is formed, it is lowered in the bath so that a new layer can be formed on top. Hull does not discuss in detail the type of polymer precursors which may be used, confining his discussion to the equipment used in the stereolithographic process. He states that the curable liquid (i.e., the polymer precursor) should cure fast enough to allow practical object formation times, should be self-adherent, should have a relatively low viscosity, should absorb UV light, should be soluble when not polymerized but insoluble when polymerized, and should be non-toxic. Hull suggests that acrylate formulations may be used and subsequent publications show that acrylate compositions have been preferred heretofore.

Acrylates are not entirely satisfactory for use in stereolithography. They are not as non-toxic as one would be like and they are not cured as rapidly and completely as would be desired. Post-curing of the solids formed by stereolithography is necessary and it is difficult to obtain rapid and complete curing of acrylates by exposure to intense UV light or exposure to elevated temperatures.

It is possible to employ polymer precursors based on vinyl ether compounds which have significant advantages over the acrylate-based formulations used heretofore in stereolithography. In U.S. patent application Ser. No. 07/661,766, compositions of vinyl ether oligomers and monomers were shown to be suitable for stereolithography.

Further improvement in compositions useful in stereolithography have been sought, particularly with regard to improving the accuracy of the finished parts. The present inventors have found improved compositions comprising vinyl ethers and epoxy compounds which provide advantages over those previously disclosed.

Vinyl ethers have been combined with epoxy compounds for use as coatings. For example, Crivello reported (*Journal of Radiation Curing*, January 1983, p. 6–13) UV cure of vinyl ether-epoxy mixtures using cationic photoinitiators. The faster curing of vinyl ethers was advantageous, while the epoxy compounds provided their inherent properties to the film.

SUMMARY OF THE INVENTION

Broadly, the invention comprises polymer precursor compositions suitable for stereolithography, such compositions comprising vinyl ether functionalized compounds plus epoxy functionalized compounds with an effective amount of a cationic photoinitiator. Both the vinyl ethers and epoxides are curable by acid released by said photoinitiator and are used in proportions selected to provide a polymeric structure having suitable green strength when vinyl ether compounds are polymerized by a suitable light source, such as UV or visible laser in stereolithography. More particularly, the vinyl ethers may be derived from urethanes, phenols, esters, ethers, siloxanes carbonates and aliphatic or aromatic hydrocarbons. The epoxides may include those derived from phenols, particularly bisphenol A, novolacs, linear and cycloaliphatic polyols, polyether polyols and siloxanes. Preferably, both the vinyl ether compounds and the epoxides will have a functionality of 2 or more.

In one embodiment the polymer precursor compositions are formulated with vinyl ether compounds and epoxides such that the composition can be characterized by the formula $$M = \frac{F}{E}$$

where
M is the vinyl ether equivalent weight of the composition
F is the total weight in grams of the composition, including both vinyl ether and epoxy compounds
E is the number of vinyl ether equivalents in the composition The vinyl ether equivalent weight of the composition (M) should be between 80 and 800 and preferably between 120 and 450. The viscosity of the composition should generally be low, but may range from 50 to 50,000 mPa.s, preferably between 50 and 5000 mPa.s.

A cationic photoinitiator is used preferably in the amount of about 0.1 to 5 wt. % of the composition. Typical photoinitiators are onium salts of Group V, VI, and VII elements, particularly iodonium or sulfonium salts.

In one aspect the invention is a process for forming three-dimensional objects by exposing a bath of the above compositions to repeated exposure to actinic light, such as ultraviolet or visible light from a laser.

DESCRIPTION OF THE PREFERRED EMBODIMENTS

Figure 1:
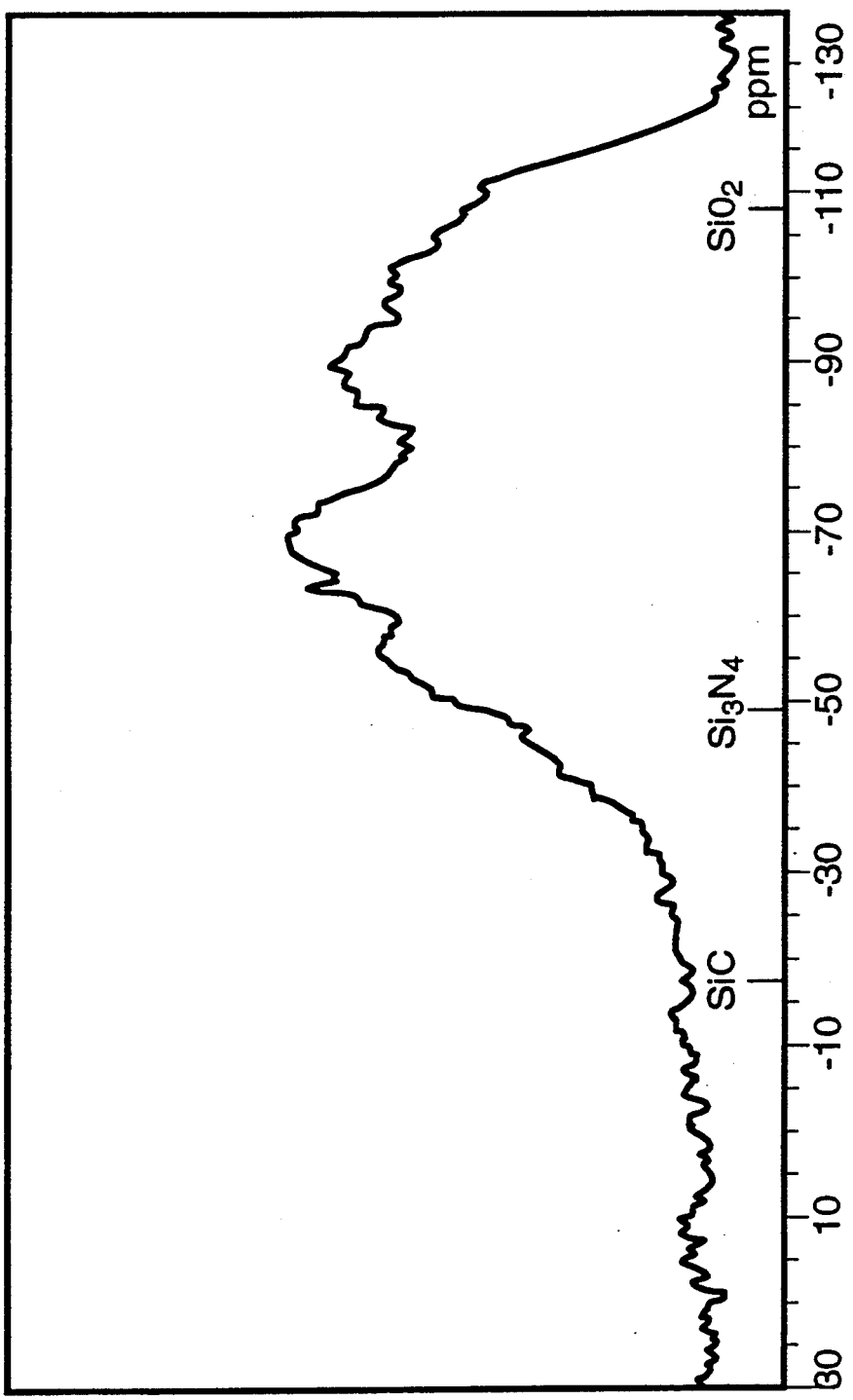
FIG. 1 is a plot of cure depth versus laser exposure for a vinyl ether/epoxy composition.

Compositions of the invention comprise vinyl ethers and epoxides. In general, vinyl ether functionalized compounds of interest would include those derived from urethanes, phenols, esters, ethers, siloxanes, carbonates and aliphatic or aromatic hydrocarbons. The epoxides will generally include the broad classes of available epoxy functionalized compounds such as those derived from phenols, particularly bisphenol A, novolacs, linear or cycloaliphatic diols, polyether diols and siloxanes.

The present inventors have found that by combining vinyl ethers with epoxides that a major deficiency of previous compositions for use in stereolithography can be overcome. In particular, they have found that the distortion which heretofore has been present in three-dimensional parts made by stereolithography can be substantially reduced. This problem will be discussed in more detail later, but for present purposes the distortion may be considered to result particularly during the initial forming of a laser cured or "green" structure in stereolithographic equipment. However, by combining vinyl ethers with epoxides the present inventors have found that it is possible to rapidly cure the vinyl ethers while leaving the epoxide largely uncured. This provides a "green part" having sufficient strength to be handled but having little distortion. Then, the green piece can be thermally post-cured so that the epoxide cures under the influence of the photo acids generated during the UV or visible laser exposure. Thermal post-curing preferably is isotropic and any additional shrinkage that occurs should not produce additional distortion in the part.

The vinyl ethers may include vinyl ether oligomers and/or multifunctional and/or monofunctional vinyl ether monomers.

VINYL ETHER OLIGOMERS

The vinyl ether oligomers may be generally described as

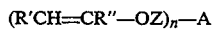
$(R'CH{=}CR''{-}OZ)_n{-}A$ where
R' and R" are H or an alkyl group having 1 to 10 carbon atoms
A is a moiety derived from urethanes, phenols, polyesters, polyethers, polycarbonates, or polysiloxanes and has a molecular weight of about 400 to 10,000
Z is a moiety derived from a saturated aliphatic or cycloaliphatic hydrocarbon or a polyalkylene ether and has a molecular weight of about 28 to 250
n is an integer from 2 to 6, preferably 2 or more.
Such oligomers are described in detail below.

Vinyl Ether Urethane Oligomers

Where A is derived from a urethane the vinyl ether urethane oligomer may be obtained by reacting
(i) a hydroxyl-terminated polyester having the formula

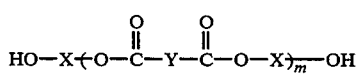
$$HO{-}X{+}O{-}\overset{O}{\overset{\|}{C}}{-}Y{-}\overset{O}{\overset{\|}{C}}{-}O{-}X{\underset{m}{\rightarrow}}OH$$

where
X and Y are divalent radicals having a molecular weight of about 28 to 500 and selected from the group consisting of alkylene, arylene, aralkylene, and cycloalkylene radicals
m has an average value of about 1 to 100
and (ii) a diisocyanate having the formula

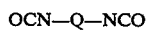
$OCN{-}Q{-}NCO$ where
Q is a divalent radical selected from the group consisting of alkylene, arylene, aralkylene, and cycloalkylene radicals or a polyisocyanate having a functionality greater than 2 and (iii) a hydroxy monovinyl ether having the formula

$R'CH{=}CR''O{-}Z{-}OH$ where
R' and R" are mono valent radicals selected from the group consisting of H and alkyl groups having 1–10 carbon atoms
Z is a divalent radical having a molecular weight of about 28 to 250 and selected from the group consisting of alkylene, cycloalkylene, or polyalkylene ether radicals In an alternative embodiment, the vinyl ether urethane oligomer may be one in which the polyester of (i) is replaced entirely or in part by a hydroxy-terminated polyether having the general formula

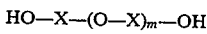
$HO{-}X{-}(O{-}X)_m{-}OH$ where m and x are as defined for the polyester of (i).

The moieties X and Y may be alkylene groups, especially those containing up to about 20 carbon atoms, a cycloalkylene group, an arylene, or aralkylene group. Examples of the alkylene moieties which may be used include ethylene, propylene, butylene, pentylene, hexylene, heptylene, octylene, nonylene, decylene, undecylene, dodecylene, tridecylene, tetradecylene, pentadecylene, hexadecylene, heptadecylene, octa-decylene, nonadecylene, and eicosylene. Examples of arylene groups include phenylene, naphthylene, anthrylene, phenanthrylene, etc. Cycloalkylene groups include the cyclopentylene, cyclohexylene, cycloheptylene, cyclooctylene, and cycloalkylene groups containing 1 or more alkyl groups on the nucleus. Similarly, the arylene groups which may be used for Y also may contain one or more alkyl groups on the aromatic ring, especially where such alkyl groups contain up to about 6 carbon atoms. Examples of aralkylene groups include benzylene, 1-phenethylene, 2-phenethylene, 3-phenylpropylene, 2-phenylpropylene, 1-phenylpropylene, etc. Particularly useful Y groups are $-(CH_2)_n-$ groups where n is 2, 3, or 4; 1,2, 1,3, or 1,4 phenylene groups; and 1,4 cyclohexylene groups. Particularly useful X groups are $-CH_2CH_2-$; $-CH_2CH_2-O-CH_2CH_2-$; $-CH_2-(CH_3)CH-$; $-(CH_2)_n-$ where n is 4 or 6; $-CH_2-(CH_3)_2C-CH_2-$; 1,4 phenylene; and 1,4-bis(methyl)phenylene.

m will be an integer from 1 to about 100, preferably from 1 to 10.

Particularly preferred hydroxyl-terminated polyesters include poly(propylene adipate), poly(neopentyl adipate), poly(1,4-butane adipate), poly(1,6-hexane adipate), poly(neopentyl isophthalate), and poly(1,6-hexane isophthalate). Polyesters derived from mixed polyols or acids may be useful. Particularly important are polyesters in which triols such as trimethylol propane or glycerol are incorporated into the polyester to produce a polyester with a functionality > 2. The preferred molecular weights for the polyesters will be about 500 to 5000.

In the alternative embodiment where polyethers are used, X preferably will be $-CH_2CH_2-$, $-CH_2(CH_3)CH-$, and $-CH_2CH_2CH_2CH_2-$. The molecular weight preferably will be about 250 to 5,000. Mixed polyethers may also be used, for example, those derived from a polyol, such as ethoxylated or propoxylated trimethylol propane.

A broad variety of diisocyanates may be used and may be exemplified by such materials as the toluene diisocyanates (TDI), p- and m-phenylene diisocyanate, 1,4-tetramethylene diisocyanate, 1,6-hexamethylene diisocyanate, 2,2,4-trimethylhexamethylene diisocyanate, 1,4-cyclohexane diisocyanate, 4,4'-di-cyclohexylmethane diisocyanate (Desmodur W), 4,4'-diphenylmethane diisocyanate (MDI), 3,3'-dimethyl-4,4-diphenylmethane diisocyanate, 1,5-tetrahydronaphthalene diisocyanate, naphthalene-1,5'-diisocyanate, bis(2-methyl-3-isocyanatephenyl)methane, 4,4'-diphenylpropane diisocyanate, tetramethylxylene diisocyanate (TMXDI), isophorone diisocyanate (IPDI).

Polyisocyanates with a functionality of 2 or more such as are described and discussed in U.S. Pat. No. 4,433,067, especially the polyisocyanates based on methylenediphenyl diisocyanate, especially the 4,4'-isomer and the uretonimine modified MDI as described there, also may be utilized. The term polyisocyanate also includes quasi prepolymers of polyisocyanates with active hydrogen containing materials where the polyisocyanate is typically reacted with from about 0.05 to about 0.3 equivalents of a polyol. Although a vast number of polyisocyanates are suitable, in practice polyisocyanates based on MDI and TDI may be preferred for economy and general availability.

Among the most desirable isocyanates may be mentioned 4,4'-diphenylmethane diisocyanate, toluene diisocyanate, isophorone diisocyanate, m-tetramethylxylene diisocyanate, 4,4'-dicyclohexylmethane diisocyanate (Desmodur W), and 1,6-hexamethylene diisocyanate.

The vinyl ether terminated alcohols which are used in preparing the oligomeric esters have a structure corresponding to the adduct of an alkyne and a diol. In one method, a diol may be reacted with acetylene. However, these vinyl ether terminated alcohols also can be made in other ways, and the method of producing them is not part of this invention. The resulting hydroxy monovinyl ether may be purified or in many cases the reaction mixture, which includes divinyl ether and residual diol may be used directly. The alkyne has the generic formula R'C≡CR", and the diol has the generic formula HO—Z—OH. The generic formula of the vinyl ether terminated alcohols of our invention is

R'CH=CR"O—ZOH.

The groups R' and R" are independently selected from the group consisting of hydrogen and lower alkyl moieties containing from 1 to 10 carbon atoms, although those with from 1 to about 4 carbon atoms are favored. It is preferable that both R' and R" are not alkyl moieties, for in the case where both are lower alkyl groups this causes an undesirable reduction in polymerization rate of the oligomers of our invention. Where R' is an alkyl moiety it is preferred that R" be hydrogen, and conversely; where R' is hydrogen then R" should be an alkyl of 1 to 4 carbons. In a preferred embodiment R' or R" is a methyl group and R" and R' is hydrogen. In a still more preferred embodiment both R' and R" are hydrogen.

Z will be a divalent radical having a molecular weight of 28 to about 250 and selected from the group consisting of alkylene, cycloalkylene, or polyalkylene ether radicals. In one preferred embodiment, Z is ethylene, butylene, or dimethylene cyclohexane radicals.

Among the diols one important class consists of alkylene glycols, HO(C$_n$H$_{2n}$)OH, where n is an integer from 2 to about 10. The linear alkylene glycols, HO(CH$_2$)$_n$OH, (polymethylenediols), where n is an integer from 2 to about 10, are particularly useful, especially where n is from 2 to about 6. Illustrative of the members of this group are such diols as ethylene glycol, 1,3-propylene glycol, 1,4-butanediol, 1,5-pentanediol, 1,6-hexanediol, 1,7-heptanediol, 1,8-octanediol, 1,9-nonanediol, and 1,10-decanediol (decamethylene glycol).

The nonlinear or branched alkylene diols also may be used, where such glycols contain from 3 up to about 10 carbon atoms. Examples include 1,2-propylene glycol, 2,3-butanediol, 2,3-dimethyl-2,3-butanediol, 2,3-dimethyl-1,4-butanediol, 2,2-dimethyl-1,3-propanediol(-neopentylglycol).

Another useful class of diols are the polyalkylene glycols, especially poly(ethylene) glycols, HO-[—CH$_2$CH$_2$O—]$_m$OH, and poly(propylene) glycol, HO-[—CH(CH$_3$)CH$_2$O—]$_m$OH, where m is an integer from 1 up through about 50, although more usually m is an integer from 1 up to about 10, and most preferably from 1 up to about 5. Examples of these glycols include diethylene glycol, triethylene glycol, tetraethylene glycol, pentaethylene glycol, hexaethylene glycol, etc., along with the analogs of the propylene glycols.

Of particular importance is the case where Z is a divalent radical whose parent is a cycloalkane, such as cyclopentane, cyclohexane, cycloheptane, or cyclooctane, preferably the bishydroxy alkyl derivatives. The preferred diols are the 1,3-bis(hydroxyalkyl)cyclopentanes and the 1,4-bis(hydroxyalkyl)cyclohexanes, -cycloheptanes, and -cyclooctanes, particularly the cyclohexanes. Diols substituted at positions different from those specified above may be used in the practice of this invention, but not necessarily with equivalent results. The bis(hydroxymethyl)cyclohexanes are preferred as they are readily available from the reduction of the corresponding phthalic acids, and among these 1,4-bis(-hydroxymethyl)cyclohexane is favored.

Of the hydroxy monovinyl ethers which are produced by the reaction of acetylene with the diols described above, those which are especially preferred include 4-hydroxybutyl vinyl ether, 4-hydroxymethyl cyclohexylmethyl vinyl ether, 2-hydroxy ethyl vinyl ether, triethylene glycol monovinyl ether, and diethylene glycol monovinyl ether. In addition to the pure hydroxymonovinyl ether, mixtures containing the corresponding divinyl ether R'HC=CR"—O—Z—O—R"C=CHR' and/or the parent diol HO—Z—OH may also be used.

An important characteristic of the vinyl ether terminated urethane oligomers is that in all cases there are few hydroxyl groups derived from the polyester, polyether or hydroxy monovinyl ether in the final product. That is, less than about 10% of the initial hydroxyl groups remain unreacted. It is most preferable that the oligomeric vinyl ether terminated product contain no detectable free hydroxyl groups, i.e., less than about 1% of the initial hydroxyl groups of the reactant mixture remain unreacted. It is also important that there should be essentially no free isocyanate groups remaining in the product, that is, less than about 1% of the initial isocyanate groups of the reactant mixture. In general, the ratios of polyester (a), diisocyanate (b) and monovinyl ether (c) are selected to provide an equal number of equivalents of hydroxyl and isocyanate groups.

The vinyl ether urethane oligomers may be formed by reacting the hydroxyl-terminated polyester (a) with the isocyanate compound (b) or by reacting the isocyanate (b) with the hydroxy vinyl ether (c) and thereafter reacting the adduct with the remaining component or alternatively, the three components may be co-reacted. The ratios of (a), (b), and (c) will be chosen so that the ratio of the total number of hydroxyl groups from (a) and (c) to the number of isocyanate groups from (b) is about 1:1. The ratio of the number of hydroxyl groups from (a) to the number of hydroxyl groups from (c) should be in the range from about 0.5 to 5. The reaction may be carried out at temperatures in the range of 0° to 150° C. Solvents such as diethyl ether, methylene chloride, or toluene may be employed and later removed from the oligomers, or the components may be reacted in the absence of solvents. Divinyl ether monomers such as 1,4-cyclohexane dimethanol divinyl ether or triethylene glycol divinyl ether may also be used as solvents. Such compounds may be obtained as by-products in the preparation of hydroxy monovinyl ethers. Since they have no free hydroxyl groups they do not react with the isocyanates, but may remain with the oligomers and become included in the formulations used for stereolithography.

The reaction may be carried out without a catalyst, but a tin containing catalyst such as dibutyl tin dilaurate may be used.

Vinyl Ether Polyester Oligomers

Where A is derived from a polyester, they may be considered the product obtained by reacting (a) a dicarboxylic acid having the formula

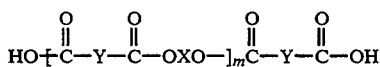

where X, Y, and m are defined above with respect to vinyl ether urethane oligomers (b) with a hydroxy monovinyl ether having the formula $$R'CH=CR''OZOH$$

where R', R'' and Z are defined above with respect to vinyl ether urethane oligomers Vinyl Ether Polysiloxanes Where A is derived from a polysiloxane, they will typically include those in which a polysiloxane having Si—H groups is reacted by hydrosilation with a vinyl ether containing a second C=C group not directly bonded to an oxygen atom. The vinyl ether polysiloxanes may be defined as

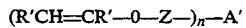

where
R', R'', and Z are as defined above.
n is an integer from 2 to 8
A' is a polysiloxane having n Si—H groups and a molecular weight of 140 to 5,000

The polysiloxane may be linear, cyclic, or a combination of both types and may be substituted with aliphatic or aromatic moieties. Preferred substituents on the Si atoms are methyl and phenyl groups.

Vinyl Ether Phenolics

Where A is derived from a phenol, they may be defined as

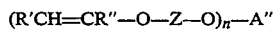

A'' is a polyvalent aromatic radical having a molecular weight of about 152 to 5,000
R', R'' and Z are as defined above
n is 2 to 6

In one preferred embodiment Z is ethylene and A'' is derived from 4',4'-isopropylidene diphenol (i.e. bisphenol A).

Vinyl Ether Polyethers

Where A is derived from a polyether they may be obtained by reacting poly(ethylene oxy), poly(propylene oxy) or poly(butyleneoxy) glycols, i.e., HO—[—CH$_2$CH$_2$O]$_m$—H, HO—[—CH(CH$_3$)CH$_2$O]$_m$—H, or HO—[—(CH$_2$)$_4$O]$_m$—H, respectively, where m has an average value from 2 to 50 with acetylene or a vinyloxy alkyl halide, for example, 2-chloroethyl vinyl ether.

Vinyl Ether Carbonates

Vinyl ether terminated carbonates may be described by the formula

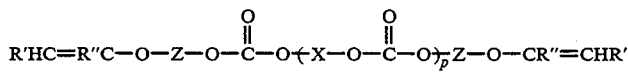

where
p is 4 to 10
Z is a divalent radical as defined above
X is a diester, diol, or polyol moiety

VINYL ETHER MONOMERS

The structure of the vinyl ether monomers may be similar to those of the oligomers described above but the monomers will have lower molecular weights. When their viscosity is low, they are useful as reactive diluents in the stereolithography formulations.

The vinyl ether monomers may be generally described by the formula

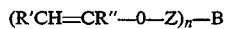

where
R' and R'' are as defined above
Z is as defined above
n is an integer from 1 to 4
B is derived from aromatic and aliphatic hydrocarbons, esters, ethers, siloxanes, urethanes, and carbonates, and has a molecular weight of about 60 to 400

Monofunctional monomers are those which have n=1, while the multifunctional monomers are those which have n=2 to 4.

Vinyl Ether Monomers from Esters

Vinyl ether terminated ester monomers may be described by the formula

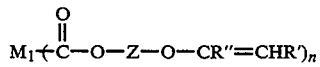

where
n is 1 to 4,
M$_1$ is a mono, di, tri, or tetra functional radical having a molecular weight of 15 to 180 and selected from the group consisting of alkylene, arylene, aralkylene and cycloalkylene radicals, Z is a divalent radical having a molecular weight of 28 to 290 and selected from the group consisting of alkylene, cycloalkylene, or polyalkylene ether radicals, R' and R" are monovalent radicals selected from the group consisting of H and alkyl groups having 1-10 carbon atoms In one preferred embodiment $M_1$ is a mono, di, tri, or tetra functional radical of benzene. In another embodiment, $M_1$ is alkylene with 2-4 carbon atoms and Z is the $\alpha,\alpha'$ diradical derived from 1,4-dimethylcyclohexane.

Vinyl Ether Monomers From Ethers

Vinyl ether terminated ether monomers are related to the polyether oligomers described above but the molecular weight is much lower, i.e., "m" is only about 1 to 5.

Vinyl Ether Monomers From Aliphatic Hydrocarbons

Vinyl ether terminated aliphatic monomers may be described by the formula

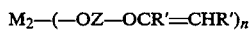

$$M_2-(-OZ-OCR'=CHR')_n$$

where n is 1 to 4

$M_2$ is a mono, di, tri, or tetra functional aliphatic or cycloaliphatic radical having a molecular weight of about 56 to 500

Z is a divalent radical as defined above

R' and R" are monovalent radicals as defined above

Vinyl Ether Monomers From Aromatic Hydrocarbons

Vinyl ether terminated aromatic monomers may be described by the formula

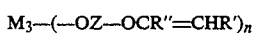

$$M_3-(-OZ-OCR''=CHR')_n$$

where n is 1 to 4

$M_3$ is a mono, di, tri, or tetrafunctional aromatic radical having a molecular weight of about 77 to 500

Z is a divalent radical as defined above

R' and R" are monovalent radicals as defined above

Vinyl Ether Siloxanes

Vinyl ether terminated siloxane monomers are related to the polysiloxane oligmers described above but the molecular weight is lower, i.e. A' has a molecular weight of about 140–500.

Vinyl Ether Carbonates

Vinyl ether terminated carbonate monomers are related to the oligomers described above but the molecular weight is lower, i.e. p is only about 0 to 3.

The vinyl ethers found to be useful may also be characterized by their physical properties and will generally have as many as possible of the following properties:

have a fast cure under UV laser exposure so that a rigid "green" part can be made have low viscosity to facilitate flow of the prepolymers over the surface of the article being formed have a relatively high modulus as first formed by the laser beam, i.e., in the green form have a functionality of at least 2, that is, have at least two vinyl ether moieties in each molecule have minimal absorption of light from the laser beam.

Preferred vinyl ethers which have been found to be particularly useful include bisphenol A derivatives and other aromatic vinyl ethers including

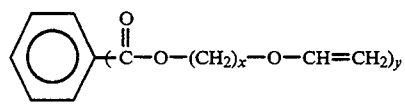

where x is 2 or 4
y is 2 or 3

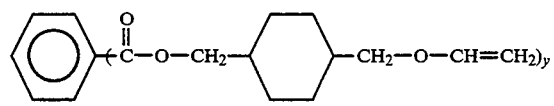

where y is 2
and ester derived vinyl ethers including

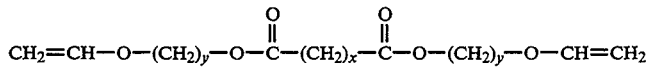

where x is 2, 3, or 4
y is 2 or 4
and

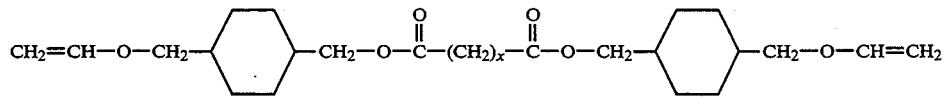

where x is 2, 3, or 4
and cycloaliphatic diol derived vinyl ethers including

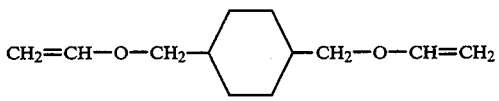

and poly ether derived divinyl ethers including

$$CH_2=CH-O-(CH_2CH_2O)_x-CH=CH_2$$

where x is 2, 3, or 4

or $CH_2=CH-O+CH_2-CH-O\}_xCH=CH_2$ where x is 2, 3, or 4

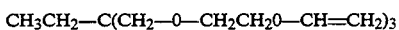

$$CH_3CH_2-C(CH_2-O-CH_2CH_2O-CH=CH_2)_3$$

and phenol derived vinyl ethers including

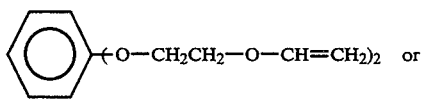

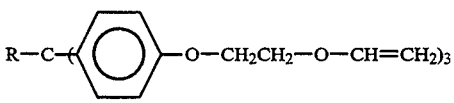

where R is H or CH₃

Vinyl ether oligomers may include urethane oligomers derived from isocyanates, such as MDI (4,4'-diphenylmethane diisocyanate), reacted with a hydroxyl terminated polyester such as poly(propylene adipate) and a mono vinyl ether such as cyclohexane dimethanol vinyl ether. Polyether oligomers may include polytetrahydrofuran reacted with acetylene to form the vinyl ether. Polyester oligomers include the reaction product of polytetrahydrofuran with dimethyl adipate, end-capped by reaction with bis(4-vinyloxybutyl)isophthalate.

Epoxides

The epoxides which are useful in the invention should have as many as possible of the following properties
- have a functionality of at least two, that is have at least two oxirane moieties for each molecule
- have a low cure rate relative to the vinyl ethers used in the formulation
- contribute a low viscosity to the formulation
- do not plasticize vinyl ether polymerized by the laser
- are miscible with the selected vinyl ethers
- have minimal absorption of light from the laser beam Preferred epoxides include those derived from phenols, particularly bisphenol A, novolacs, linear and cyclo aliphatic polyols, poly ether polyols and siloxanes. In general, many of the available epoxides may find application in the invention. Of particular interest are glycidyl ethers of phenols. Cycloaliphatic epoxides, which may be used but not necessarily with equivalent results. Examples of glycidyl ethers are bisphenol A diglycidyl ethers (e.g. DER 331, 332, Dow Chemical) and Epon 828, Shell Chemical). Other examples are epoxy novolacs (e.g. Quatrex 240, DEN 431, Dow Chemical) and epoxy cresols (e.g. Quatrex 3310, Dow Chemical). Examples of cycloaliphatic epoxides (e.g. ERL-221, ERL-4299, ERL-4234, Union Carbide).

Formulation of Polymer Precursor Compositions

An important aspect of the selection of vinyl ethers and epoxides for use in stereolithography is the viscosity of the formulation. In general, the final formulations should have a viscosity in the range of 50 to 50,000 mPas, preferably 50–5000 mPas. The viscosity of the formulation should be relatively low in order to facilitate the movement of the liquid prepolymers over the solid piece being formed by the stereolithography apparatus. The vinyl ethers may have a high viscosity with the epoxides having low viscosity or vice versa. Alternatively, both may have low viscosity. High viscosities are useable, but not preferred.

The proportions of vinyl ethers and epoxides do not depend on their reaction with each other, since they primarily form homopolymers and the final product may be an interpenetrating polymer network. However, the proportions must be selected so that the green structure has acceptable strength and can retain the substantially unreacted epoxides until thermal post-curing can be carried out. It has been found that the proportions of vinyl ethers and epoxides should be within the boundaries defined by the formula $$M = \frac{F}{E}$$

where
- M is the vinyl ether equivalent weight of the composition
- F is the total weight in grams of the composition, including both vinyl ether and epoxy compounds
- E is the number of vinyl ether equivalents in the composition The vinyl ether equivalent weight (M) should be between 80 and 800 and preferably between 120 and 450. The defining equation takes no account of the relative number of equivalents of epoxide groups, only the equivalents of vinyl ether groups. If the vinyl ether equivalent weight (M) is too high, the green strength may be too low. If M is too low, the curl distortion may be too high. In practice, the M value chosen will depend on the amount of distortion or linear shrinkage which can be tolerated for the parts to be made from the formulation.

Another factor to be considered is the relative reaction speed of the vinyl ethers. Generally, the vinyl ether oligomers are less reactive, particularly the urethane oligomers. Since they also have a greater weight for the number of vinyl ether equivalents the value of M will be higher, making it desirable to include lower molecular weight polyfunctional vinyl ethers to decrease the value of M.

The value of $E_{crit}$ is also a factor which must be considered when formulating for a stereolithographic application. (See examples 5 and 6 below). Too low a value is undesirable since the formula may prematurely polymerize or it may decrease the accuracy of the parts. A high value of $E_{crit}$ implies a slower rate of reaction and reduced production of parts. However, compensation is possible when formulating so that a desired value of $E_{crit}$ is obtained. Among the vinyl ether oligomers and monomers the value of $E_{crit}$ is affected by the molecular composition and structure of the substituents. For example, adding low molecular weight vinyl ethers will generally decrease the value of $E_{crit}$, while increasing the amount of vinyl ether oligomers will generally increase the value.

Ambient humidity will affect the rate of polymerization. Consequently, it may be necessary to adjust the value of $E_{crit}$ by reformulation, typically to lower the $E_{crit}$ to compensate for the effect of increased humidity.

Still another factor to be considered is the effect of heat released during polymerization. When the polymerization reaction is too fast, damage to the polymer may result. Less reactive vinyl ethers would be chosen to avoid such a result or the value of M could be increased.

An effective amount of a cationic photoinitiator is used to cause the vinyl ethers to react and produce the desired polymer. The recognized classes of cationic photoinitiators include various compounds which respond to irradiation by producing acid species capable of catalyzing cationic polymerization. See Crivello, *Advances in Polymer Science*, 62, p. 1–48 (1984). Onium salts of Group V, VI, and VII elements are stated to be the most efficient and versatile of the cationic photoinitiators. They generate strong Lewis acids which can promote cationic polymerization. Curing of the vinyl ether compositions of the invention is not limited to a particular class of such photoinitiators, although certain types are preferred, including onium salts based on halogens and sulfur. More specifically, the onium salt photoinitiators described in Crivello's U.S. Pat. No. 4,058,400 and in particular iodonium and sulfonium salts of $BF_4^-$, $PF_6^-$, $SbF_6^-$, and $SO_3CF_3^-$. Preferred photoinitiators are triarylsulfonium salts, and diaryliodonium salts. Preferred anions are hexafluorophosphate and hexafluoroantimonate. They are usually required in amounts from about 0.1 to 5 wt. % in the blended formula of vinyl ethers and epoxides. Preferred initiators include:

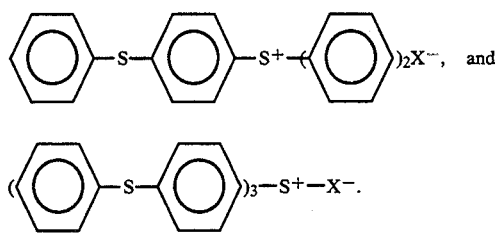

where X is $SbF_6^-$ or $PF_6^-$

Commercially available initiators include UVI-6974 (an $SbF_6^-$ salt) and UVI-6990 (a $PF_6^-$ salt) supplied by Union Carbide. Other cationic photoinitiators are defined by the formulas

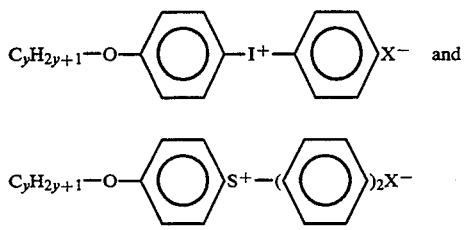

where y is 1 to 18

In addition to the principal ingredients discussed above, the formulations may also contain dyes, stabilizers, fillers, pigments, and antioxidants such as hindered phenols, wetting agents such as fluorosurfactants e.g. FC-430 from 3-M, photosensitizers such as benzophenone, thioxanthone, perylene and other components familiar to those skilled in the art.

Stereolithography

The vinyl ether epoxy formulations of this invention may be polymerized by exposure to known sources of energy such as electron beams, ultraviolet light, high temperatures, and the like. In stereolithographic applications, the polymer formulation forms a liquid bath in which the precursors are polymerized in successive layers, typically by repeated exposure to actinic light, particularly a UV or visible laser beam, such as ultraviolet light from helium/cadmium laser or an argon ion laser or visible light from an argon ion laser. After the three-dimensional shape has been formed, it is removed from the bath, washed as necessary with isopropanol or other suitable solvent, and cured further by thermal means, which could be supplemented by ultraviolet or visible light if desired.

The vinyl ether-epoxide formulations of the invention have several advantages over the acrylate-based formulations of the art. In particular, the vinyl ethers and epoxides can be post-cured by heating and generally do not require the use of UV light for post-curing, although it may be of benefit where portions of the formulation have intentionally been left within the green structure. However, radiation post-curing is required for acrylate formulations, since they cannot be thermally post-cured without the use of a thermal initiator, which undesirably reduces pot life of the acrylate formulation.

The addition of epoxides to the vinyl ethers brings significant improvements not necessarily evident. Distortion of the object produced by stereolithography is a major problem with currently used polymerizable formulations. (See the paper by Hull, *Recent Advances in Stereolithography*, 1990.) That is, the object produced does not precisely match the shape wanted, even though that shape is accurately traced out by the UV laser beam. Such distortion can be quite severe and certainly limits the usefulness of stereolithography in manufacturing. The difficulties are believed to result from several factors. One source of inaccuracy is caused by the stress created when one layer of photo polymer is laser cured and shrinks on top a previously cured layer. The result is a tendency to warp the layers. This phenomenon has been called "curl distortion." Another source of inaccuracy occurs during post-curing. The "green" (i.e. partially cured) shape may not receive uniform amounts of the UV or visible light which may cause the part to bend or become distorted. This phenomenon has been called "post-cure distortion."

It has now been found that by including epoxides with vinyl ether formulations that the distortion in the parts made by stereolithography is much reduced. This is believed to result from the difference in speed of polymerization. The vinyl ethers polymerize quickly and thus are capable of producing a "green" shape in which little, if any, of the epoxides are polymerized. At that time little distortion has occurred. Since the epoxides are principally cured in a thermal post-curing step, their effect on the shape as they polymerize is minimal. This post-curing also requires the photo-acids, produced by the action of the laser on the photoinitiator, but these are long-lived and remain in the polymers during the post-curing. Typically, the post-curing is done thermally by exposure to a temperature of about 50° C. to 200° C. for 0.2 to 10 hours. Alternatively, post-curing can be supplemented or even carried out entirely using UV or visible light, but this procedure may result in additional distortion because it is difficult to obtain uniform exposure of complex solid shapes.

EXAMPLE 1

A vinyl ether/epoxy formulation having an M value of 500 grams of formulation for each vinyl ether equivalent consisting of 1,4-cyclohexane dimethanol divinyl ether (19.6%), DER 331 (80.4%), and UVI-6974 (2.5 pph) was placed in a dish on a motor driven platform under the UV output (351,360 nm) of an Argon ion laser (ca. 13 milliwatts). The dish was moved through the beam at speed of 61 mm/min (2.4 inches/min). A "string") of solid polymer was created along the path of the laser in the dish. The string had an average thickness of 0.94 mm (0.037 inches) and was 0.23 mm (0.009 inches) wide. The string was very soft and elastomeric. After thermal post curing (20 min. @ 100° C.), the string was stronger and more rigid, indicating that additional conversion of polymerizable groups occurs under these conditions.

EXAMPLE 2

A mixture of 19.6 wt. % 1,4-cyclohexane dimethanol divinyl ether and 80.4 wt. % DER 331 was prepared and 0.4 pph of UVI-6974 was added. The mixture was coated on a sodium chloride infrared window and then cured by exposure to UV light (500 mj/cm$^2$) using a medium pressure mercury arc lamp. Then the UV cured coating was cured further at 100° C. for 60 minutes. An infrared spectrum was measured before curing and after the UV and thermal curing. The disappearance of the 1635 cm$^{-1}$ band indicated that 87% of the vinyl ether had reacted while disappearance of the 916 cm$^{-1}$ band showed that only 29% of the epoxy had been reacted after the exposure to UV light. However, after the thermal postcure at least 95% of the epoxy groups had been reacted, thus illustrating that epoxy cures later than the vinyl ether which was polymerized mainly during the UV exposure.

EXAMPLE 3

A group of vinyl ether monomers were mixed with a commercial epoxy (DER331, Dow Chemical) which is a diglycidyl ether of bisphenol A, Each of the formulations had an M value of 500 grams of formulation for each equivalent of vinyl ether, A triaryl sulfonium salt initiator was added at 0.5 pph (Union Carbide UVI-6974), The mixtures were coated on a glass plate and cured by UV irradiation at 500 mj/cm$^2$ using a medium pressure mercury arc lamp, Thereafter the cured films were removed from the glass plates and measured for their shrinkage and tensile strength, The films were next thermally postcured for 60 minutes at 100° C. and measured again. The results are presented in the following table.

TABLE A

| Sample | Vinyl Ether Monomer | Vinyl Ether Wt. % | Epoxy Wt. % |
| --- | --- | --- | --- |
| A | 1,4-cyclohexane dimethanol-divinyl ether (CHVE) | 19.6 | 80.4 |
| B | bis (4-vinyloxy butyl) isophthalate[(1)] | 34.8 | 65.2 |
| C | bis (4-vinyloxy methyl cyclohexyl methyl) glutarate[(2)] | 43.6 | 56.4 |
| D | bis (4-vinyl oxybutyl) succinate | 31.0 | 69.0 |
| E | bisphenol-A diethoxy vinyl ether | 36.8 | 63.2 |

| | Shrinkage (%) | | Modulus, MPa (Ksi) | | Tensile Strength, MPa (Ksi) | | Elongation, % | |
| --- | --- | --- | --- | --- | --- | --- | --- | --- |
| | UV | Postcure | UV | Postcure | UV | Postcure | UV | Postcure |
| A | 4.5 | 4.8 | 1172(170) | 2158(313) | 25.5(3.7) | 77.9(11.3) | 14.8 | 7.9 |
| B | 4.4 | 5.3 | 814(118) | 1923(279) | 20(2.9) | 55.2(8.0) | 58 | 7.2 |
| C | 3.2 | 4.6 | 621(90) | 1723(250) | 17.2(2.5) | 50.3(7.3) | 49 | 7.0 |
| D | 3.7 | 5.4 | 1034(150) | 1675(243) | 24.9(3.6) | 44.1(6.4) | 6.8 | 4.5 |
| E | 3.5 | 4.1 | 752(109) | 2206(320) | 28.3(4.1) | 69.6(10.1) | 24.7 | 6.8 |

[(1)]Vectomer ™ 4010, Allied-Signal
[(2)]Vectomer ™ 4020, Allied-Signal

The increased modulus and tensile strength indicates that a thermal post-curing reaction is occurring in all of these formulations.

EXAMPLE 4

46 parts by weight of bisphenol-A-diethoxy vinyl ether (BPEVE) and 54 parts by weight of a diglycidyl ether of bisphenol-A (DER 331, Dow Chemical) were mixed with 0.44 pph of triaryl sulfonium salt as a photoinitiator (UVI-6974, Union Carbide). This polymer precursor composition (M=400) was a clear liquid with a viscosity of 1,724 cps at 30° C.

EXAMPLE 5

The composition of Example 4 was placed in a shallow dish in a 3D Systems Model SLA-190 stereolithography unit at 30° C. The laser (He—Cd, 325 nm output) was scanned across the resin at various speeds to produce a series of rectangular layers varying in depth depending on the time of exposure. The resulting series of cured rectangles (resembling a railroad track with the rectangular layers being the cross-ties) was removed from the bath 18.5 minutes after exposure and the thickness of the layers were measured with a micrometer. A plot of the thickness of the layers versus the exposure is shown in FIG. 1. It will be seen that a linear relationship between the depth of cure and the exposure resulted. $E_{crit}$ is the minimum exposure which induced polymerization.

EXAMPLE 6

Figure 2:
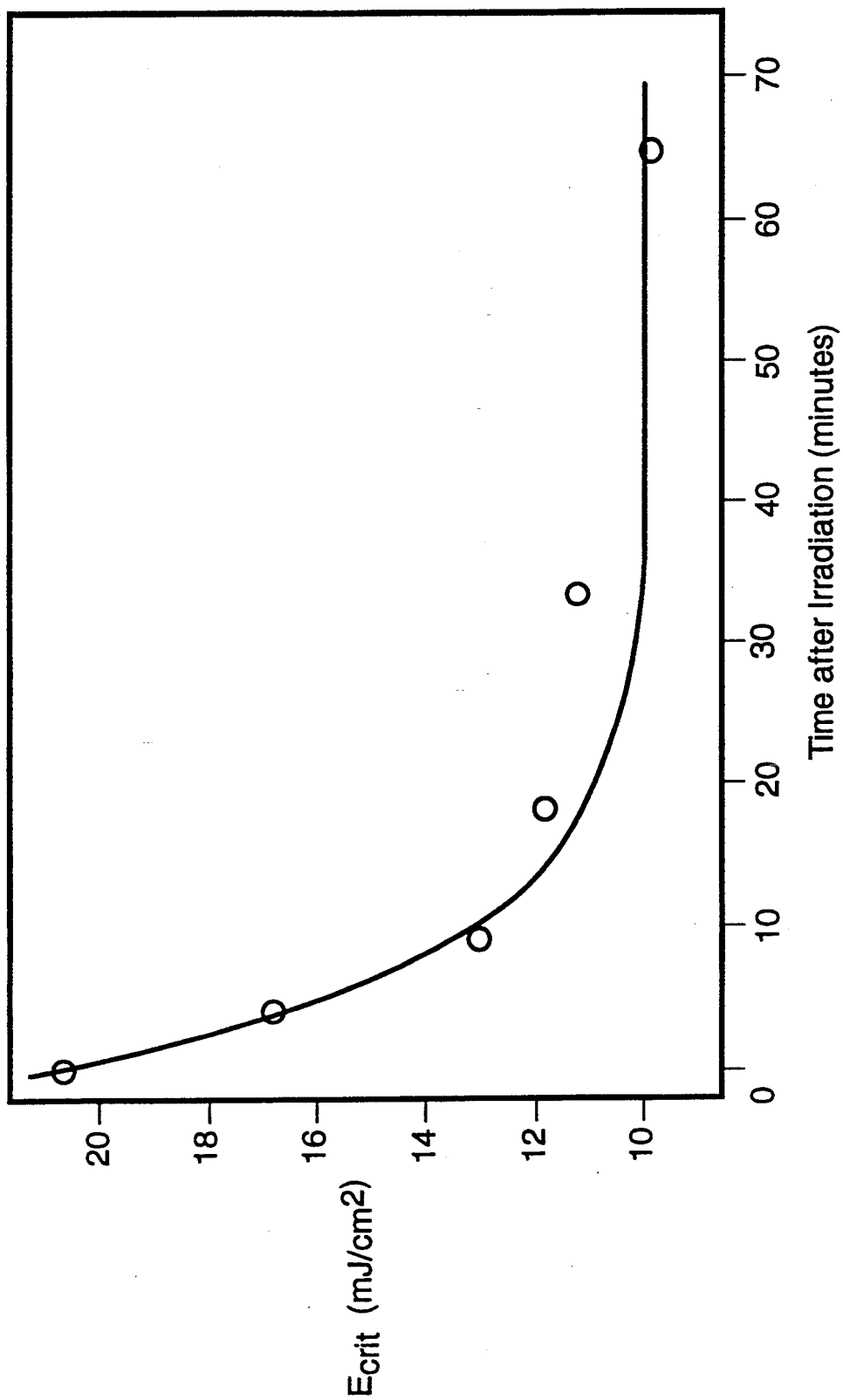
FIG. 2 is a plot of $E_{crit}$ (gel/dose) versus time for the composition of FIG. 1.
Figure 1:
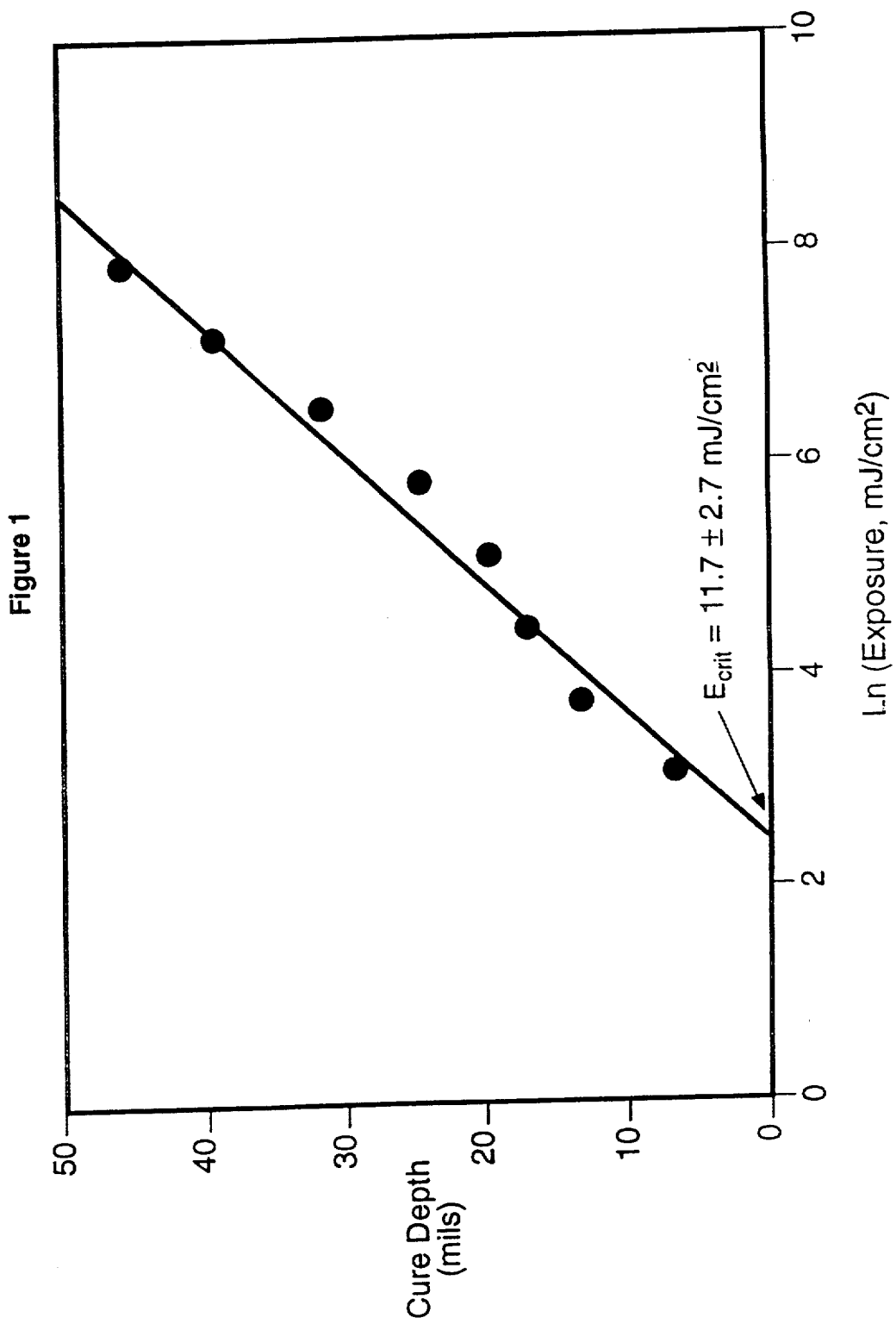

The experiment of Example 5 as repeated except that instead of 18.5 minutes the test parts were removed at varying times after laser irradiation. The minimum exposure required, $E_{crit}$, was found to decrease as the time increased as shown in FIG. 2. It can be seen that the minimum value for $E_{crit}$ was achieved at about 30 minutes and reducing the exposure had essentially no effect even after much longer periods of time.

EXAMPLE 7

The experiment of Example 6 was repeated except that the width (rather than depth) of the parts was measured. The following table shows the results.

TABLE B

| Time in Dish After Irrad. (min) | Width (mm) versus Laser Dose (J/cm$^2$) | | | | |
| --- | --- | --- | --- | --- | --- |
| | 5.6 | 2.8 | 1.4 | 0.7 | 0.35 |
| <0.1 | 1.63 | 1.58 | 1.54 | 1.50 | 1.44 |
| 0.5 | 1.60 | 1.58 | 1.50 | 1.50 | 1.50 |
| 4.25 | 1.63 | 1.60 | 1.50 | 1.50 | 1.45 |
| 9.0 | 1.63 | 1.58 | 1.56 | 1.55 | 1.46 |
| 18.5 | 1.63 | 1.58 | 1.50 | 1.48 | 1.40 |
| 33.5 | 1.63 | 1.58 | 1.55 | 1.50 | 1.45 |
| 41.0 | 1.63 | 1.58 | 1.52 | 1.51 | 1.45 |
| 64.6 | 1.63 | 1.58 | 1.55 | 1.54 | 1.45 |

It can be seen that there was essentially no polymerization except where the laser contacted the polymer precursor liquid, i.e., the width of the layer did not increase due to the laser-initiated polymerization.

EXAMPLE 8

The composition of Example 4 was used in the same apparatus to produce a tensile test specimen. The test part was removed less than one minute after irradiation. Tensile measurements were made within 30 minutes. This test part was compared with equivalent parts which were further cured in an oven at 80° C. for 60 minutes. The results of tensile testing are given in the following table.

TABLE C

| Cure | Tensile, Strength MPa | Modulus MPa | Elongation % |
| --- | --- | --- | --- |
| Laser only | 7.6 | 76 | 53 |
| Laser + thermal | 49 | 1500 | 7.8 |

These results indicate the significant increase in strength obtained from thermal postcuring of the vinyl ether/epoxy composition of the invention.

EXAMPLE 9

The composition of Example 4 was used in the same stereolithographic equipment to make three-dimensional test parts using a "weave" laser drawing procedure developed by 3D Systems. The part made was 42 mm long and 3 mm wide with a depth of 6 mm for 14 mm distances from each end and 8 mm for 14 mm in the middle of the piece. It was postcured at 80° C. for 60 minutes. A curl distortion factor $CF_6$ was determined to be 4.9% applying the formula (see paper by C. W. Hull referred to previously):

$$CF_6 = \frac{H_0 - H_6}{6} (100)$$

where
$H_0$ = height defined by the CAD model
$H_6$ = height of the test part measured 6 mm from the 8 mm deep base

EXAMPLE 10

The experiment of Example 6 was repeated using a commercial acrylate/methacrylate resin (Ciba Geigy XB-5139). The test part was postcured by ultraviolet light in a 3D Systems Model PCA-1 postcuring apparatus (the Ciba Geigy resin does not thermally postcure). A cure distortion factor of 17.7% was measured, indicating the advantage for the vinyl ether/epoxy compositions of the invention.

EXAMPLE 11

The composition of Example 4 was used to make a model of a turbine blade and its housing. The part was thermally cured at 80° C. for 60 minutes. It was an accurate representation of the CAD model.

EXAMPLE 12

One standard for stability of a stereolithographic resin is that there should be less than 100% change in viscosity for 6 months at 30° C. or 3 days at 80° C.

A vinyl ether/epoxy formulation was prepared comprising 46% bisphenol-A-diethyoxy vinyl ether (BPEVE) and 54% of a diglycidyl ether bisphenol-A (DER-331, Dow Chemical) along with 0.44 pph of a triarylsulfonium salt photoinitiator (UVI-6974, Union Carbide). The viscosity of the mixture was measured at 30° C. using a Brookfield Viscometer, small sample adapter and spindle 28 at 100 rpm. This mixture was a clear liquid with a viscosity of 1,724 mPa.s (cps) at 30° C. The mixture was then used for the fabrication of several stereolithographic parts. The mixture was then placed in an oven at 85° C. for three days. The clear liquid after heating had a viscosity of 1,771 mPa.s (cps) at 30° C. After three days at 85° C., the mixture showed an increase in viscosity of only 2.7%, which exceeds the stability requirement for a stereolithographic resin.

EXAMPLE 13 (Comparative)

A comparison of the thermal stability of the vinyl ether/epoxy mixture described in Example 12 to a commercial acrylate/methacrylate stereolithography resin (Ciba Geigy XB-5139) was made. The fresh XB-5139 resin had a viscosity of 844 mPa.s (cps) (measured at 30° C.), which increased to 1,047 cps (at 30° C.) after heating at 85° C. for 60 hours. Thus, the commercial XB-5139 resin showed a significant 24% increase in its viscosity, and therefore a lower thermal stability compared to the vinyl ether/epoxy formulation from Example 12.

EXAMPLE 14

A vinyl ether terminated aromatic diester/epoxy formulation was prepared comprising 60% bis(4-vinyloxybutyl)isophthalate vinyl ether (Vectomer 4010, Allied-Signal), and 40% diglycidyl ether of bisphenol-A (DER-331, Dow Chemical) along with 0.453 pph of a triarylsulfonium salt photoinitiator (UVI-6974, Union Carbide). This mixture (M=300) was a clear liquid with a viscosity of 150 cps at 30° C.

The formulation was placed in a shallow dish within a 3D Systems SLA-190 stereolithography apparatus at 30° C. The laser (He—Cd, 325 nm output) was scanned across the resin at various speeds effectively producing a series of small rectangular shaped cured layers that were exposed with different doses of UV laser light. The test part was removed from the dish after exposure and the thickness of the ties were measured with a micrometer. A plot of thickness (cure depth) vs. exposure yielded a straight line, and from the intercept $E_{crit}=40$ mJ/cm$^2$.

The formulation was used to construct multi-layer three dimensional diagnostic test parts as in Example 9 using the SLA-190 with a "weave" laser drawing scheme. A curl distortion factor ($CF_6$) of 1.5% was obtained by comparing the dimensions of the test part to the original CAD model.

EXAMPLE 15

The formulation from Example 14 was used to build a multi-layer three dimensional part. The part originated from a CAD model of a turbine blade and housing. After fabrication with the SLA-190, a rigid plastic part was obtained. The part appeared to be an accurate representation of the original CAD model.

EXAMPLE 16

A vinyl ether terminated aromatic diester/epoxy-novolac formulation was prepared comprising 60% bis(4-vinyloxybutyl)isophthalate vinyl ether (Vectomer 4010, Allied-Signal), and 40% of a phenol epoxy novolac resin (Quatrex-2410, Dow Chemical) along with 0.457 pph of a triarylsulfonium salt photoinitiator (UVI-6974, Union Carbide). This mixture (M=300) was a clear liquid (a slight yellow color) with a viscosity of 2,191 cps at 30° C.

The formulation was placed in a shallow dish within a 3D Systems SLA-190 stereolithography apparatus at 30° C. The laser (He—Cd, 325 nm output) was scanned across the resin at various speeds effectively producing a series of small rectangular shaped cured layers that were exposed with different doses of UV laser light. The test part was removed from the dish after exposure and the thickness of the ties were measured with a micrometer. A plot of thickness (cure depth) vs. exposure yielded a straight line, and from the intercept $E_{crit}=25$ mJ/cm$^2$.

The formulation was used to construct multi-layer three dimensional diagnostic test parts as in Example 9 using the SLA-190 with a "weave" laser drawing scheme. A curl distortion factor (CF$_6$) of 9% was obtained by comparing the dimensions of the test part to the original CAD model.

EXAMPLE 17

The formulation from Example 16 was used to build a multi-layer three dimensional part. The part originated from a CAD model of a turbine blade and housing. After fabrication with the SLA-190, a rigid plastic part was obtained. The part appeared to be an accurate representation of the original CAD model.

EXAMPLE 18

The formulation from Example 16 was used to build a multi-layer three dimensional part. The part originated from a CAD model of a distributor cap and housing. After fabrication with the SLA-190, a rigid plastic part was obtained. The part appeared to be an accurate representation of the original CAD model.

EXAMPLE 19

A vinyl ether terminated aromatic diester/epoxy-novolac/diglycidyl aromatic ether formulation was prepared comprising 60.5% bis(4-vinyloxybutyl)-isophthalate vinyl ether (Vectomer 4010, Allied-Signal), 25.5% phenol epoxy novolac resin (Quatrex-2410, Dow Chemical), and 14% diglycidyl ether of bisphenol-A (DER-332, Dow Chemical) along with 0.48 pph of a triarylsulfonium salt photoinitiator (UVI-6974, Union Carbide). This mixture (M=300) was a clear liquid (a slight yellow color) with a viscosity of 497 cps at 30° C.

The formulation was placed in a shallow dish within a 3D Systems SLA-190 stereolithography apparatus at 30° C. The laser (He—Cd, 325 nm output) was scanned across the resin at various speeds effectively producing a series of small rectangular shaped cured layers that were exposed with different doses of UV laser light. The test part was removed from the dish after exposure and the thickness of the ties were measured with a micrometer. A plot of thickness (cure depth) vs. exposure yielded a straight line, and from the intercept $E_{crit}=25$ mJ/cm$^2$.

The formulation was used to construct multi-layer three dimensional diagnostic test parts as in Example 9 using the SLA-190 with a "weave" laser drawing scheme. A curl distortion factor (CF$_6$) of 15% was obtained by comparing the dimensions of the test part to the original CAD model.

EXAMPLE 20

A formulation was prepared combining 13 wt. % of a polyurethane oligomer (Vectomer TM 2010, Allied-Signal) which is the reaction product of MDI and poly(propylene adipate) and cyclohexane dimethanol vinyl ether (CHMVE), with 15 wt. % trimethylol propane trivinyl ether (TMPTVE), 38 wt. % CHVE, 34 wt. % of the diglycidyl ether of bisphenol A (DER-331, Dow Chemical) and 0.50 pph of triarylsulfonium hexafluoroantimonate (UVI-6974, Union Carbide) as a cationic photoinitiator. This mixture has a value for M=169.

The formulation was placed in a shallow dish within a 3D Systems SLA-190 stereolithography apparatus at 30° C. The laser (He—Cd, 325 nm output) was scanned across the resin at various speeds, as described in Example 5 and a value of $E_{crit}$ of 64.8 mJ/cm$^2$ was determined.

The effect of post curing was measured by pencil hardness tests of UV-cured films and films which had been cured by UV and then post cured. 6 mil (0.15 mm) films were cured at 420 mJ/cm$^2$ at 25° C. and 29% relative humidity and tested for pencil hardness after 5 minutes. Other films were post cured at 100° C. for 30 minutes and then tested. The hardness is reported as the hardest pencil which did not tear the films. The results are given in the following table.

TABLE D

| Cure | Pencil Hardness |
| --- | --- |
| UV Only | 2B |
| UV & Thermal | >6H |

It can be seen that thermal postcuring provides a significant increase in film strength.

EXAMPLE 21

A formulation was prepared combining 54 wt. % of a polyether oligomer which is the reaction product of polytetrahydrofuran (250 m.w., BASF) and acetylene, with 46 wt. % DER-331 and 0.5 pph of UVI-6974. This mixture has a value for M=323.

The formulation was placed in a shallow dish in the 3D Systems SLA-190 apparatus and tested as described in Example 5. A value of $E_{crit}$ 14.5 mJ/cm$^2$ was determined.

Pencil hardness tests were carried out as described in Example 20 with the following results.

TABLE E

| Cure | Pencil Hardness |
| --- | --- |
| UV Only | 3B |
| UV & Thermal | >6H |

EXAMPLE 22

A formulation was prepared combining 19 wt. % of a vinyl ether end capped polyester oligomer which is the reaction product of polytetrahydrofuran (250 m.w., BASF), dimethyl adipate, and bis(4-vinyloxybutyl) isophthalate (Vectomer TM 4010, Allied-Signal) with 29 wt. % DER-331, 15 wt. % TMPTVE and 0.44 pph of UVI-6974. This mixture has a value for M=172.

The formulation was placed in a shallow dish in the 3D Systems SLA-190 apparatus and tested as described in Example 5. A value of $E_{crit}$ 26.2 mJ/cm$^2$ was determined.

Pencil hardness tests were carried out as described in Example 20 with the following results.

TABLE F

| Cure | Pencil Hardness |
| --- | --- |
| UV Only | >6H (flexible) |

TABLE F-continued

| Cure | Pencil Hardness |
| --- | --- |
| UV & Thermal | >6H (brittle) |

We claim:

1. A polymer precursor composition for forming three-dimensional objects by stereolithography consisting essentially of
   (a) vinyl ether functionalized compounds;
   (b) epoxy functionalized compounds;
   (c) an effective amount of a cationic photoinitiator; said vinyl ether compounds and epoxy compounds both being curable by acids released by said photoinitiator and having proportions selected to provide a three-dimensional polymeric object having suitable green strength with minimal curl distortion when said composition is polymerized in stereolithography by a light source selected from the group consisting of UV and visible light lasers and defined by the formula M=F/E
   where
   M is the vinyl ether equivalent weight of the composition and has a value between 80 and 800
   F is the total weight in grams of the composition
   E is the number of vinyl ether equivalents in the composition.

2. A polymer precursor composition of claim 1 wherein said vinyl ether compounds are derived from at least one member of the groups consisting of urethanes, phenols, esters, ethers, siloxanes, carbonates, and aliphatic or aromatic hydrocarbons.

3. The polymer precursor composition of claim 2 wherein the vinyl ether compounds comprise oligomers having the formula

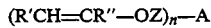

where R' and R" are H or an alkyl group having 1 to 10 carbon atoms
A is a moiety derived from at least one of the group consisting of urethanes, phenols, polyesters, polyethers, polysiloxanes, polycarbonates and has a molecular weight of about 400 to 10,000
Z is a moiety derived from a saturated aliphatic or cyclo aliphatic hydrocarbon or a polyalkylene ether and has a molecular weight of about 28 to 250
n is an integer from 2 to 6.

4. The composition of claim 3 wherein said vinyl ether oligomers are derived from a urethane obtained by reacting
   (i) an hydroxyl terminated polyester having the formula

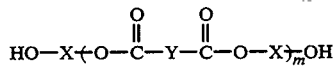

where
X and Y are divalent radicals having a molecular weight of 28 to about 500 and selected from the group consisting of alkylene, arylene, aralkylene, and cycloalkylene radicals m has an average value of 1 to about 100 and
   (ii) a diisocyanate having the formula

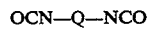

where
Q is a divalent radical selected from the group consisting of alkylene, arylene, aralkylene, and cycloalkylene radicals or a polyisocyanate having a functionality greater than 2
and (iii) a hydroxy monovinyl ether having the formula

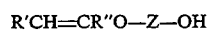

where
R' and R" are mono valent radicals selected from the group consisting of H and alkyl groups having 1-10 carbon atoms
Z is a divalent radical having a molecular weight of 28 to about 250 and selected from the group consisting of alkylene, cycloalkylene, or polyalkylene ether radicals.

5. The composition of claim 3 wherein said vinyl ether oligomers are derived from a urethane obtained by reacting
   (i) an hydroxyl terminated polyether having the formula

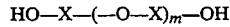

where
m has an average value of 1 to about 100
X is a divalent radical having a molecular weight of 28 to about 500 and selected from the group consisting of alkylene, arylene, aralkylene, and cycloalkylene radicals
and (ii) a diisocyanate having the formula

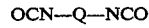

where
Q is a divalent radical selected from the group consisting of alkylene, arylene, aralkylene, and cycloalkylene radicals or a polyisocyanate having a functionality greater than 2
and (iii) a hydroxy monovinyl ether having the formula

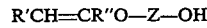

where
R' and R" are mono valent radicals selected from the group consisting of H and alkyl groups having 1-10 carbon atoms
Z is a divalent radical having a molecular weight of 28 to about 250 and selected from the group consisting of alkylene, cycloalkylene, or polyalkylene ether radicals.

6. The composition of claim 3 wherein said vinyl ether oligomers are derived from a polyester obtained by reacting
   (a) a dicarboxylic acid having the formula

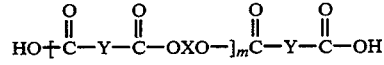

where
X and Y are divalent radicals having a molecular weight of about 28 to 500 and selected from the group consisting of alkylene, arylene, aralkylene, and cycloalkylene radicals
m has an average value of about 1 to 100

(b) with a hydroxy monovinyl ether having the formula

where
R' and R" are monovalent radicals selected from the group consisting of H and alkyl groups having 1-10 carbon atoms
Z is a divalent radical having a molecular weight of about 28 to 250 and selected from the group consisting of alkylene, cycloalkylene, or polyalkylene ether radicals.

7. The composition of claim 3 wherein said vinyl ether oligomers are derived from a polysiloxane defined as

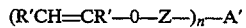

where
R', R", and Z are as defined above,
n is an integer from 2 to 8
A' is a polysiloxane having n Si—H groups and a molecular weight of 140 to 5,000.

8. The composition of claim 3 wherein said vinyl ether oligomers are derived from a phenol defined as

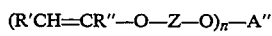

where
A" is a polyvalent aromatic radical having a molecular weight of about 152 to 5,000
R', R" and Z are as defined above
n is 2 to 6.

9. The composition of claim 3 wherein said vinyl ether oligomers are derived from a polyether by reacting at least one of the groups consisting of poly(ethylene oxy), poly(propylene oxy), or poly(butylene oxy) glycols, where m has an average value from about 2 to 50 with acetylene or a vinyl oxy alkyl halide.

10. The polymer precursor composition of claim 3 wherein the vinyl ether oligomers are derived from a carbonate defined as

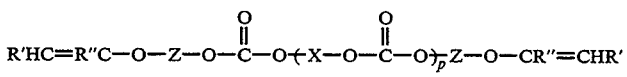

where
p is 4 to 10
Z is a divalent radical having a molecular weight of about 28 to 250 and selected from the group consisting of alkylene, cycloalkylene or polyalkylene ether radicals
X is a diester, diol, or polyol moiety.

11. The composition of claim 2 wherein R' and R" are hydrogen.

12. The composition of claim 2 wherein R' is methyl and R" is hydrogen.

13. The polymer precursor composition of claim 2 wherein the vinyl ether compounds comprise monomers having the formula

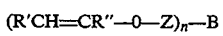

where
R' and R" are H or an alkyl group having 1 to 10 carbon atoms

Z is a moiety derived from a saturated aliphatic or cyclo aliphatic hydrocarbon or a poly alkylene ether and has a molecular weight of about 28 to 250
n is an integer from 1 to 4
B is derived from at least one of the group consisting of aliphatic and aromatic hydrocarbons, esters, ethers, siloxanes, urethanes, and carbonates and has a molecular weight of about 60 to 400.

14. The composition of claim 13 wherein R' and R" are hydrogen.

15. The composition of claim 13 wherein R' is methyl and R" is hydrogen.

16. The composition of claim 13 wherein said vinyl ether monomers are derived from esters and having the formula

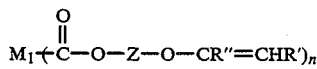

where
n is 1 to 4,
$M_1$ is a mono, di, tri, or tetra functional radical having a molecular weight of 15 to 180 and selected from the group consisting of alkylene, arylene, aralkylene and cycloalkylene radicals
Z is a divalent radical having a molecular weight of 28 to 290 and selected from the group consisting of alkylene, cycloalkylene, or polyalkylene ether radicals
R' and R" are monovalent radicals selected from the group consisting of H and alkyl groups having 1-10 carbon atoms.

17. The composition of claim 13 wherein said vinyl ether monomers are derived from ethers by reacting at least one of the group consisting of poly(ethyleneoxy), poly(propyleneoxy), or poly(butyleneoxy) glycols, where m has an average value from about 1 to about 5 with acetylene or a vinyl oxy alkyl halide.

18. The composition of claim 13 wherein said vinyl ether monomers are derived from aliphatic hydrocarbons described by the formula

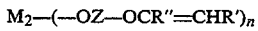

where
n is 1 to 4
$M_2$ is a mono, di, tri, or tetra functional aliphatic or cycloaliphatic radical having a molecular weight of about 56 to 500
Z is a divalent radical having a molecular weight of 28 to about 250 and selected from the group consisting of alkylene, cycloalkylene or polyalkylene ether radicals
R' and R" are monovalent radicals selected from the group consisting of H and alkyl groups having 1-10 carbon atoms.

19. The composition of claim 13 wherein said vinyl ether monomers are derived from aromatic hydrocarbons described by the formula

where
- n is 1 to 4
- $M_3$ is a mono, di, tri, or tetrafunctional aromatic radical having a molecular weight of about 77 to 500
- Z is a divalent radical having a molecular weight of 28 to about 250 and selected from the group consisting of alkylene, cycloalkylene or polyalkylene ether radicals
- R' and R" are monovalent radicals selected from the group consisting of H and alkyl groups having 1–10 carbon atoms.

20. The composition of claim 13 wherein said vinyl ether monomers are derived from a polysiloxane defined as

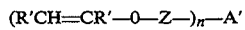

where
- R', R", and Z are defined above
- n is an integer from 2 to 8
- A' is a polysiloxane having n Si—H groups and a molecular weight of 140 to 500.

21. The composition of claim 13 wherein said vinyl ether monomers are derived from a carbonate defined as

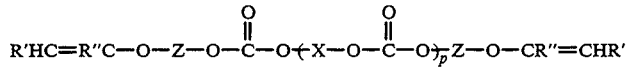

where
- p is 0 to 3
- Z is a divalent radical having a molecular weight of about 28 to 250 and selected from the group consisting of alkylene, cycloalkylene or polyalkylene ether radicals
- X is a diester, diol, or polyol moiety.

22. A polymer precursor composition of claim 1 wherein said epoxy compounds are derived from at least one member of the group consisting of phenols, novolacs, aliphatic or cycloaliphatic polyols, and polyether polyols and siloxanes.

* * * * *

UNITED STATES PATENT AND TRADEMARK OFFICE
CERTIFICATE OF CORRECTION

PATENT NO. : 5,437,964

DATED : August 1, 1995

INVENTOR(S) : Stephen C. Lapin et al.

It is certified that error appears in the above-indentified patent and that said Letters Patent is hereby corrected as shown below:

Title page, should be deleted to be replaced with the attached title page.

The drawing sheet consisting of Fig 1, should be deleted to be replaced with the drawing sheet, consisting of Fig. 1, as shown on the attached page.

United States Patent [19]

Lapin et al.

[11] Patent Number: 5,437,964
[45] Date of Patent: Aug. 1, 1995

[54] STEREOLITHOGRAPHY USING VINYL ETHER-EPOXIDE POLYMERS

[75] Inventors: Stephen C. Lapin, Wauconda; James R. Snyder, Chicago; Eugene V. Sitzmann, Des Plaines; Darryl K. Barnes, Bellwood; George D. Green, Park Ridge, all of Ill.

[73] Assignee: Allied-Signal Inc., Morris Township, Morris County, N.J.

[21] Appl. No.: 201,146

[22] Filed: Feb. 24, 1994

Related U.S. Application Data

[63] Continuation of Ser. No. 855,392, Mar. 26, 1992, abandoned, which is a continuation-in-part of Ser. No. 693,890, May 1, 1991, abandoned.

[51] Int. Cl.⁶ .................. G03C 5/00; G03C 1/725; C08F 2/46
[52] U.S. Cl. .................. 430/280; 430/269; 522/168; 522/170
[58] Field of Search ............... 522/170, 168; 430/269, 430/280

[56] References Cited

U.S. PATENT DOCUMENTS

| 3,311,575 | 3/1967 | Graham | 526/266 |
|---|---|---|---|
| 4,575,330 | 3/1986 | Hull | 425/174.4 |
| 4,645,781 | 2/1987 | Koleske | 522/170 |
| 4,844,144 | 7/1989 | Murphy et al. | 164/38 |
| 4,885,319 | 12/1989 | Dougherty | 522/170 |
| 4,942,001 | 7/1990 | Murphy et al. | 264/22 |
| 4,956,198 | 9/1990 | Shama et al. | 427/54.1 |
| 5,036,112 | 7/1991 | Dougherty | 522/181 |
| 5,039,716 | 8/1991 | Vara | 522/170 |
| 5,045,572 | 9/1991 | Plotkin | 522/170 |
| 5,055,357 | 10/1991 | Plotkin | 522/170 |
| 5,106,885 | 4/1992 | Liu | 522/170 |
| 5,139,872 | 8/1992 | Lapin | 428/378 |

FOREIGN PATENT DOCUMENTS

| 1246785 | 12/1988 | Canada. |
| 0171069 | 12/1986 | European Pat. Off. . |
| 0360869 | 4/1990 | European Pat. Off. . |
| 0429250 | 5/1991 | European Pat. Off. . |
| 2355794 | 1/1978 | France. |
| WO90/01512 | 2/1990 | WIPO. |
| WO89/08021 | 2/1990 | WIPO. |
| WO90/03989 | 4/1990 | WIPO. |
| 9111466 | 8/1991 | WIPO. |

OTHER PUBLICATIONS

Lapin, Chemical Abstracts No. 115:116379c "Vinyl Ether . . . ", vol. 115, No. 12, pp. 95. Sep. 1991.
Crivello et al., "Photoinitiated Cationic Polymerization with Multifunctional Vinyl Ether Monomers". Jan. 1983, pp. 6–13.
C. W. Hull, "Recent Advances in Stereolithography". Oct. 1, 1990.

*Primary Examiner*—Mark A. Chapman
*Attorney, Agent, or Firm*—Harold N. Wells; Roger H. Criss

[57] ABSTRACT

Polymer precursor formulations suitable for stereolithography may be prepared from compositions containing vinyl ether functionalized compounds and epoxy functionalized compounds plus an effective amount of a cationic photoinitiator.

22 Claims, 2 Drawing Sheets

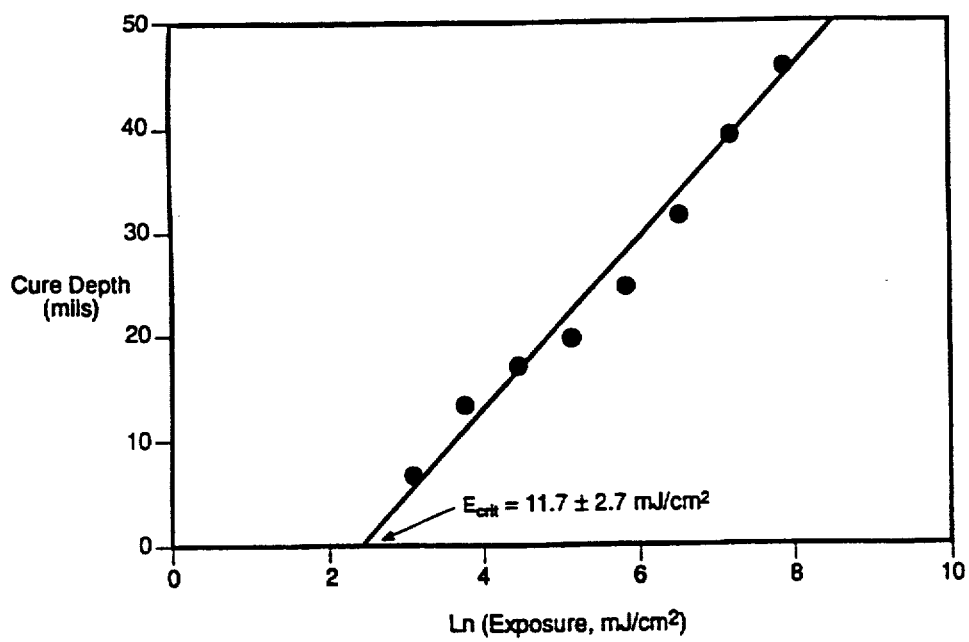

UNITED STATES PATENT AND TRADEMARK OFFICE
CERTIFICATE OF CORRECTION

PATENT NO. : 5,437,964   Page 3 of 5
DATED : August 1, 1995
INVENTOR(S) : Stephen C. Lapin et al.

It is certified that error appears in the above-indentified patent and that said Letters Patent is hereby corrected as shown below:

Column 2, line 15: insert "," after --siloxanes--
Column 4, line 13: insert "." after --radicals--
Column 7, line 49: insert "," after --oligomers--
Column 7, line 64: insert "." after --5,000--
Column 8, line 10: insert "." after --6--
Column 8, line 34: insert "." after --moiety--
Column 8, line 53: insert "." after --400--
Column 9, line 9: insert "." after --atoms--
Column 9, line 35: insert "." after --above
Column 9, line 54: insert "." after --above--
Column 10, line 56: $CH_2=CH-O-(CH_2CH_2O)_x-CH=CH_2$ should read
$CH_2=CH-O-(CH_2CH_2-O)_x-CH=CH_2$
Column 10, line 66: $CH_3CH_2-C(CH_2-O-CH_2CH_2O-CH=CH_2)_3$ should read
$CH_3CH_2-C(CH_2-O-CH_2CH_2-O-CH=CH_2)_3$
Column 11, line 54: "mPas, preferably 50-5000 mPas" should read
--mPa•s, preferably 50-5000 mPa•s--

UNITED STATES PATENT AND TRADEMARK OFFICE
CERTIFICATE OF CORRECTION

PATENT NO. : 5,437,964
DATED : August 1, 1995
INVENTOR(S) : Stephen C. Lapin et al.

It is certified that error appears in the above-indentified patent and that said Letters Patent is hereby corrected as shown below:

Column 12, line 14: insert "." after --composition--
Column 14, line 63: delete ")" after --"string"--
Column 15, line 26: after "A" delete "," and insert --.--
Column 15, line 28: after "ether" delete "," and insert --.--
Column 15, line 30: after "6974)" delete "," and insert --.--
Column 15, line 32: after "lamp" delete "," and insert --.--
Column 15, line 34: after "strength" delete "," and insert --.--
Column 15, Table A: (line 13): "   Shrinkage (%)
                               UV   Postcure     should read
                          A    4.5   4.8      "

--   Shrinkage (%)
                    UV   Postcure
               A    4.1   4.8    --

Signed and Sealed this

Twenty-sixth Day of December, 1995

Attest:

BRUCE LEHMAN

*Attesting Officer*                *Commissioner of Patents and Trademarks*